(12) United States Patent
Gu

(10) Patent No.: US 11,978,522 B2
(45) Date of Patent: May 7, 2024

(54) CHIP TEST METHOD, APPARATUS, AND DEVICE, AND STORAGE MEDIUM

(71) Applicant: CHANGXIN MEMORY TECHNOLOGIES, INC., Hefei (CN)

(72) Inventor: Cheng Gu, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 187 days.

(21) Appl. No.: 17/664,443

(22) Filed: May 23, 2022

(65) Prior Publication Data

US 2023/0282299 A1  Sep. 7, 2023

(30) Foreign Application Priority Data

Mar. 1, 2022 (CN) .......................... 202210195949.6

(51) Int. Cl.
*G11C 29/08* (2006.01)
(52) U.S. Cl.
CPC .................................. *G11C 29/08* (2013.01)

(58) Field of Classification Search
None
See application file for complete search history.

(56) References Cited

FOREIGN PATENT DOCUMENTS

| CN | 111427794 A | 7/2020 |
|---|---|---|
| CN | 112651199 A | 4/2021 |

*Primary Examiner* — Guerrier Merant
(74) *Attorney, Agent, or Firm* — Cooper Legal Group, LLC

(57) ABSTRACT

The present disclosure provides a chip test method, apparatus, and a device, and a storage medium. The chip test method includes: determining a register test adaptation file based on a register description file under a preset test environment, wherein a form of the register test adaptation file matches that of a predetermined test case template; constructing a test case based on the register test adaptation file and the test case template, and executing the test case to test a chip, wherein the determining a register test adaptation file further includes: when the preset test environment changes, determining change information of the register description file in response to the change; and changing the register test adaptation file based on the change information.

15 Claims, 4 Drawing Sheets

Table 21 — Mode Register Assignment in DDR5 SDRAM

| MR# | OP[7] | OP[6] | OP[5] | OP[4] | OP[3] | OP[2] | OP[1] | OP[0] |
|---|---|---|---|---|---|---|---|---|
| 0 | RFU | CAS Latency (RL) | | | | | Burst Length | |
| 1 | PDA Select ID | | | | PDA Enumerate ID | | | |
| 2 | Internal Write Timing | Reserved | Device 15 MPSM | CS Assertion Duration (MPC) | Max Power Saving Mode (MPSM) | 2N Mode | Write Leveling Training | Read Preamble Training |
| 3 | Write Leveling Internal Cycle Alignment - Upper Byte | | | | Write Leveling Internal Cycle Alignment - Lower Byte | | | |
| 4 | TUF | RFU | Write Range Temperature Sensor Support (Optional) | Refresh tRFC Mode | Refresh Interval Rate Indicator | Refresh Rate | | |
| 5 | Pull-Down Output Driver Impedance | | DM Enable | TDQS Enable | PODTM Support | Pull-up Output Driver Impedance | | Data Output Disable |
| 6 | tRTP | | | | Write Recovery Time | | | |
| 7 | RFU | | | | | | (Optional) Write Leveling Internal | (Optional) Write Leveling Internal |

FIG. 1A

| OP[7] | OP[6] | OP[5] | OP[4] | OP[3] | OP[2] | OP[1] | OP[0] |
|---|---|---|---|---|---|---|---|
| RFU | CAS Latency (RL) | | | | | Burst Length | |

| Function | Register Type | Operand | Data | Notes |
|---|---|---|---|---|
| Burst Length | R/W | OP[1:0] | $00_B$: BL16<br>$01_B$: BC8 OTF<br>$10_B$: BL32 (Optional)<br>$11_B$: BL32 OTF (Optional) | |
| CAS Latency (RL) | R/W | OP[6:2] | $00000_B$: 22<br>$00001_B$: 24<br>$00010_B$: 26<br>$00011_B$: 28<br>...<br>$10011_B$: 60<br>$10100_B$: 62<br>$10101_B$: 64<br>$10110_B$: 66<br>All other encodings reserved. | 1, 2 |
| RFU | RFU | OP[7] | RFU | |

FIG. 1B

CHIP TEST METHOD, APPARATUS, AND DEVICE, AND STORAGE MEDIUM

CROSS-REFERENCE TO RELATED APPLICATION

This application claims the priority of Chinese Patent Application No. 202210195949.6, submitted to the Chinese Intellectual Property Office on Mar. 1, 2022, the disclosure of which is incorporated herein in its entirety by reference.

TECHNICAL FIELD

The present disclosure relates to the technical field of chip testing, and in particular, to a chip test method, apparatus, and device, and a storage medium.

BACKGROUND

In a process of testing a chip, it is necessary to verify each register in the chip.

With the rapid development of chip technologies, the chip has an increasingly complex structure, and more registers need to be verified. Existing chip test methods have low efficiency and are error-prone. In addition, with the development of the chip technologies, the chip experiences increasingly frequent protocol replacement. For example, the Joint Electron Device Engineering Council (JEDEC) is an independent semiconductor engineering trade organization and standardization organization, which issues specifications and requirements for each generation of double data rate SDRAM (DDR SDRAM). When a protocol of the chip changes, it is usually necessary to rebuild a test environment, which is cumbersome and affects test efficiency.

SUMMARY

An overview of the subject matter detailed in the present disclosure is provided below, which is not intended to limit the protection scope of the claims.

The present disclosure provides a chip test method, apparatus, and device, and a storage medium.

According to a first aspect of the embodiments of the present disclosure, a chip test method is provided to test a chip under a preset test environment, wherein the chip test method includes:
  determining a register test adaptation file based on a register description file under the preset test environment, wherein a form of the register test adaptation file matches a form of a predetermined test case template;
  constructing a test case based on the register test adaptation file and the test case template, and executing the test case to test the chip, wherein
  the determining a register test adaptation file further includes: when the preset test environment changes, determining change information of the register description file in response to the change; and
  changing the register test adaptation file based on the change information.

A second aspect of the present disclosure provides a chip test apparatus to test a chip under a preset test environment, wherein the chip test apparatus includes:
  one or more processors; and
  a storage apparatus, configured to store one or more programs, wherein the one or more programs, when executed by the one or more processors, cause the one or more processors to execute operations of:
    determining a register test adaptation file based on a register description file under the preset test environment, wherein a form of the register test adaptation file matches a form of a predetermined test case template;
    determining change information of the register description file when the preset test environment changes, and changing the register test adaptation file;
    constructing a test case based on the register test adaptation file and the test case template; and
    executing the test case to test the chip.

According to a third aspect of the embodiments of the present disclosure, a non-transitory computer-readable storage medium is provided, wherein when executed by a processor of a test device, an instruction in the non-transitory computer-readable storage medium enables the test device to perform the following operations:
  determining a register test adaptation file based on a register description file under a preset test environment, wherein a form of the register test adaptation file matches a form of a predetermined test case template;
  constructing a test case based on the register test adaptation file and the test case template, and executing the test case to test a chip, wherein
  the determining a register test adaptation file further includes: when the preset test environment changes, determining change information of the register description file in response to the change; and
  changing the register test adaptation file based on the change information.

Other aspects of the present disclosure are understandable upon reading and understanding of the accompanying drawings and detailed description.

BRIEF DESCRIPTION OF THE DRAWINGS

The accompanying drawings incorporated into the specification and constituting part of the specification illustrate the embodiments of the present disclosure, and are used together with the description to explain the principles of the embodiments of the present disclosure. In these accompanying drawings, similar reference numerals are used to represent similar elements. The accompanying drawings in the following description are part rather than all of the embodiments of the present disclosure. Those skilled in the art may derive other accompanying drawings based on these accompanying drawings without creative efforts.

FIG. 1A and FIG. 1B are schematic diagrams of a mode register task allocation list in a JEDEC DDR5 protocol file;

DETAILED DESCRIPTION

Figure 2:
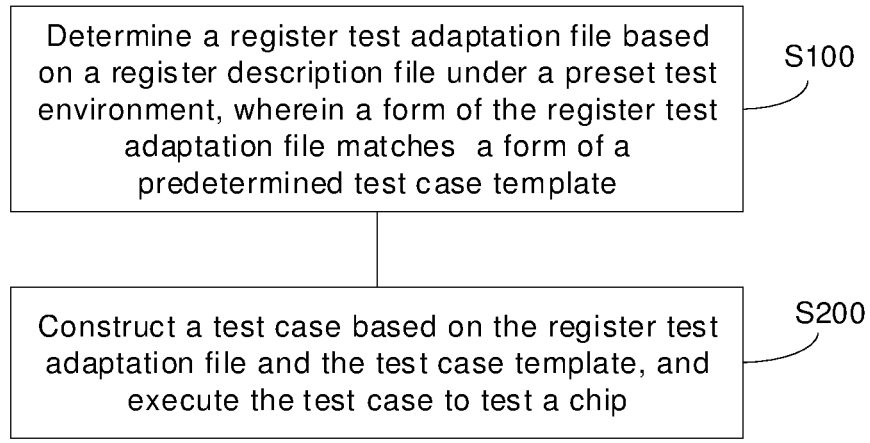
FIG. 2 is a flowchart of a chip test method according to an exemplary embodiment.

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some but not all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

In the related art, in order to verify each register in a chip, test personnel need to search for test item information of each register, such as a register address, a quantity of bits, a read/write type, a default value, and other test item information of each register, and then manually configure a test case based on the test item information of the register, in other words, manually input the test item information to a test program when configuring the test case, which is cumbersome and error-prone. Especially with the development of chip technologies, there are more registers in the chip. For example, DDR5/LPDDR5/GDDR5/PCIE and other protocols contain dozens or hundreds of registers. For each register, it is necessary to manually configure a test case and construct a test environment, resulting in a heavy workload and low efficiency. In addition, when a mode register is verified, different operands usually may correspond to different read/write types, default values, and other test item information, which further makes a test more complex and increases an error rate.

Taking FIG. 1A and FIG. 1B as an example, FIG. 1A and FIG. 1B show a mode register task allocation list in a JEDEC DDR5 protocol file. The mode register task allocation list in the protocol file is usually divided into two parts: a table of a relationship among a mode register address, an operand, and a corresponding register function of the operand, as shown in FIG. 1a; and a table of a relationship between a register function and register feature information, as shown in FIG. 1b. When configuring the test case, the test personnel need to search for a register address, a quantity of bits, a read/write type, a default value, and other test item information of each mode register in combination with FIG. 1a and FIG. 1b. The mode register may have different test item information corresponding to different operands. For example, referring to FIG. 1a, under eight operands, namely, OP [0] to OP [7], register MRO corresponds to three different register function items. Referring to FIG. 1b, different register function items correspond to different register feature information. Therefore, a test case needs to be configured for each operand of each mode register during the test, which is cumbersome and error-prone.

In addition, with the development of the chip technologies, the chip experiences increasingly frequent protocol replacement. When a protocol such as DDR5/LPDDR5 is upgraded, some registers change accordingly, for example, a part outlined by a dotted line in FIG. 1a changes. In this case, a corresponding test case needs to be reconfigured, which is cumbersome and affects test efficiency.

On this basis, the present disclosure provides a chip test method. In the chip test method, a register test adaptation file whose form matches a form of a test case template is determined based on a register description file, and then a test case is constructed based on the register test adaptation file to test a chip. Therefore, there is no need to search for and input register information cumbersomely, which improves test efficiency of the chip, reduces an error rate, and improves test accuracy. In addition, when the register test adaptation file is determined, the register test adaptation file can be adaptively changed in response to a change of a preset test environment without rebuilding the test environment, which improves test flexibility and test efficiency and facilitates later maintenance.

Exemplary embodiments of the present disclosure provide a chip test method to test a chip under a preset test environment. FIG. 2 is a flowchart of a chip test method according to an exemplary embodiment of the present disclosure. As shown in FIG. 2, the chip test method includes the following steps.

S100: Determine a register test adaptation file based on a register description file under a preset test environment, wherein a form of the register test adaptation file matches that of a predetermined test case template.

In this step, the register test adaptation file whose form matches the form of the test case template is determined for subsequent construction of a test case. The register description file is used to represent functional information of each register in the to-be-tested chip. The register description file is a file in a specific format, such as an SV file. For example, if the preset test environment is a test environment for a DDR5 protocol, the register description file is a register task allocation list in a DDR5 protocol file.

It can be seen from the above content that the register description file is a protocol file with a specific format and file type, and the form of the register description file does not match that of the test case template. In this embodiment, the register description file is converted into the register test adaptation file, such that the form of the register test adaptation file matches that of the test case template, so as to facilitate subsequent automatic generation of each test case. As an example, the register test adaptation file represents a corresponding relationship between a register and each of a register address, operand information, a quantity of bits, a read/write type, and a default register value, for example, may be in a form of a mapping or a table.

S200: Construct the test case based on the register test adaptation file and the test case template, and execute the test case to test the chip.

As described above, the form of the register test adaptation file matches that of the test case template, which makes it more convenient to construct the test case based on the register test adaptation file and the test case template to test the chip.

Figure 3:
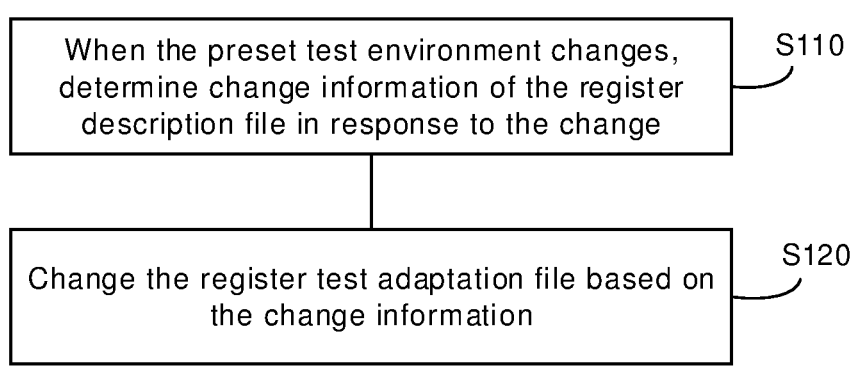
FIG. 3 is a flowchart of a chip test method according to an exemplary embodiment.

As shown in FIG. 3, step S100 may include the following steps:

S110: When the preset test environment changes, determine change information of the register description file in response to the change.

S120: Change the register test adaptation file based on the change information.

In this embodiment, when the preset test environment changes, for example, when a to-be-tested protocol is upgraded, content of the change can be determined by comparing a register description file before the change and a register description file after the change, and the register test adaptation file is modified accordingly. In this way, the test case needs to be reconfigured only for a changed register, and original configuration information may keep unchanged for other registers.

In the chip test method provided in this embodiment, the register test adaptation file whose form matches the form of the test case template is determined based on the register description file, and then the test case is constructed based on the register test adaptation file to test the chip. Therefore, there is no need to search for and input register information cumbersomely, which improves test efficiency of the chip, reduces an error rate, and improves test accuracy. In addition, when the register test adaptation file is determined, the register test adaptation file can be adaptively changed in response to the change of the preset test environment without rebuilding the test environment, which improves test flexibility and test efficiency and facilitates later maintenance.

Figure 4:
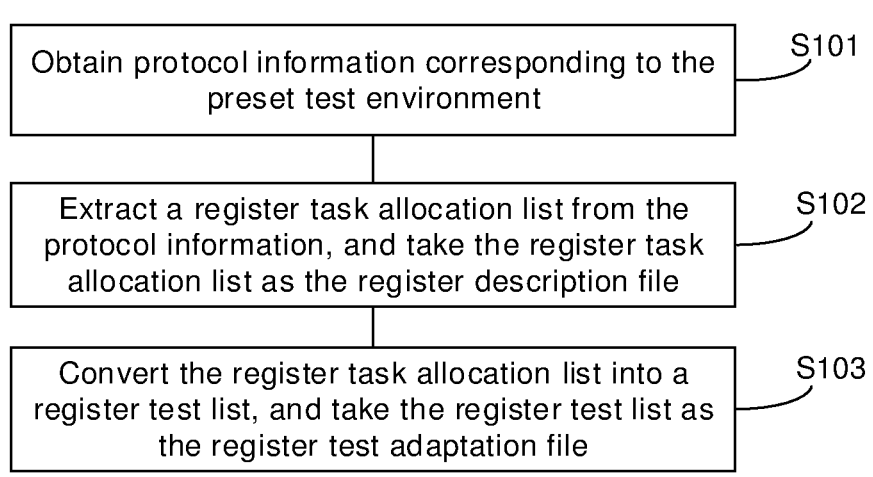
FIG. 4 is a flowchart of a chip test method according to an exemplary embodiment.

In an embodiment, as shown in FIG. 4, in step S100, the determining a register test adaptation file based on a register description file under a preset test environment includes the following steps.

S101: Obtain protocol information corresponding to the preset test environment.

For example, if the preset test environment is the test environment for the DDR5 protocol, corresponding protocol information is JEDECDDR5 protocol information. Certainly, the preset test environment may alternatively be another test environment, such as a test environment for an LPDDR5 protocol, an HMB3 protocol, or a GDDR5 protocol.

S102: Extract a register task allocation list from the protocol information, and take the register task allocation list as the register description file.

The protocol information is usually a complete protocol description file. It is necessary to extract a register-related part, namely, the register task allocation list, from the protocol information. For example, the register task allocation list in the protocol information has a header file with a register label. The register task allocation list can be extracted from the protocol information by identifying the register label. The register task allocation list may be, for example, in a form shown in FIG. 1a and FIG. 1b.

S103: Convert the register task allocation list into a register test list, and take the register test list as the register test adaptation file.

For example, the test case template is usually a combination of to-be-tested items. As shown in FIG. 1A and FIG. 1B, the form of the register task allocation list does not match that of the test case template. The register task allocation list is converted into the register test list, such that the form of the register test list matches that of the test case template. For example, the register test list is used to represent a corresponding relationship between a register and test item information, and the test item information in the register test list corresponds to the to-be-tested items in the test case template. The register test list may be an excel table or a list in another form.

In this embodiment, the register task allocation list is extracted from the protocol information first, and then the register task allocation list is converted into the register test list whose form matches the form of the test case template. Form conversion between lists makes it more convenient to perform an automatic operation, realizes high conversion efficiency, and is less prone to omission.

The test case template can be determined based on a test item to be tested for each register in the protocol information. In an exemplary embodiment, the test case template includes:

task Reg(reg_addr, bit_addr, bit_len, Wr_Rd, default value), wherein reg_addr represents a register address, bit_addr represents operand information, bit_len represents a quantity of bits, Wr_Rd represents a read/write type, and default value indicates a default register value.

In the test case template, bit_len represents the quantity of bits. When a plurality of operands of a register represent a same operation item or function, bit_len can be used to indicate a plurality of pieces of operand information, without a need to generate the test case template for each piece of operand information. This can further reduce the difficulty and cycle of generating a case file and improve efficiency.

The register address, the operand information, the quantity of bits, the read/write type, and the default register value are the to-be-tested items. Accordingly, the register test list is a list of a corresponding relationship among the register address, the operand information, the quantity of bits, the read/write type, and the default register value. In this way, test item information in each cell in the register test list can be written into the test case template to obtain a test case of each register. The test case template is set to the above format, such that the form of the register test list matches that of the test case template, so as to improve construction efficiency of the test case.

In an embodiment, one test case is correspondingly formed for each row of the register test list, and an arrangement order of a plurality pieces of test item information in each row of the register test list is consistent with that of a plurality of different to-be-configured test items in the test case template. This makes it convenient to write the test item information in the register test list into the to-be-tested test items in the test case template in order.

As an example, the register test list is shown in Table 1 below.

| Register | Sub Register | Bit | Type | Default Value |
| --- | --- | --- | --- | --- |
| 0 | Burst Length | 0 | R/W | 0 |
| 1 | MPSM | 1 | R | 0 |
| 2 | PDA Select ID | 2 | R/W | 0 |

Cells in each row represent a register address, operand information, a quantity of bits, a read/write type, and a default register value of a register respectively, and the operand information is function description information corresponding to an operand. In this way, the information in the cells in each row is correspondingly written into the to-be-tested test items in the test case template in order, so as to generate the test case corresponding to each register.

In some embodiments, when the register task allocation list is converted into the register test list, all register addresses can be first extracted from the register task allocation list and written into a register address column of the register test list in order, and then the register addresses in the register address column of the register test list are traversed. For each register address, operand information, a quantity of bits, a read/write type, and default register value that correspond to the register address are searched for in the register task allocation list and written into the register test list, so as to ensure that relevant information of each register in the register task allocation list is written into the register test list without omission.

Figure 5:
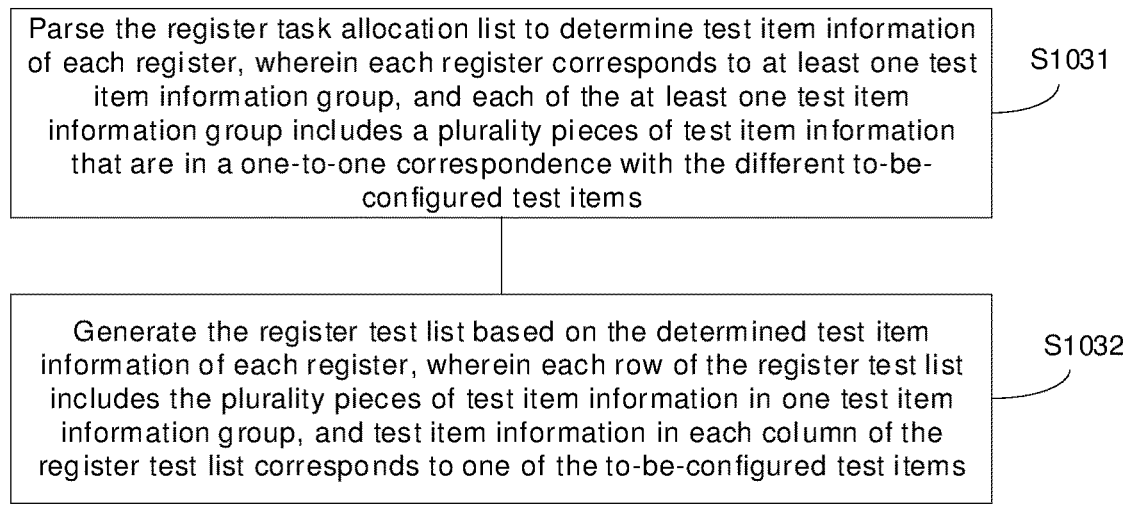
FIG. 5 is a flowchart of a chip test method according to an exemplary embodiment.

As described above, a mode register performs different functions in response to different operands, and correspondingly, register feature information is also different. For each operand of the mode register, it is necessary to generate a corresponding test case for testing. On this basis, in an exemplary embodiment, as shown in FIG. 5, step S103 includes:

S1031: Parse the register task allocation list to determine test item information of each register, wherein each register corresponds to at least one test item information group, and each of the at least one test item information group includes a plurality pieces of test item information that are in a one-to-one correspondence with the different to-be-configured test items.

In this embodiment, the determined test item information of each register is grouped. For one register, one test item information group corresponds to one operand of the register, so as to generate one test case for each operand.

S1032: Generate the register test list based on the determined test item information of each register, wherein each row of the register test list includes the plurality pieces of test item information in one test item information group, and test item information in each column of the register test list corresponds to one of the to-be-configured test items.

In this way, test cases are successively formed by row. That is, for each row, test item information in the row is written into the test case template to generate a test case, such that test cases of all registers under all operands can be completed without omission.

In this embodiment, when the register task allocation list is converted into the register test list, all the register addresses and their corresponding operands can be first extracted from the register task allocation list and written into the register address column of the register test list in order. For example, when a register corresponding to one register address has three operands, three addresses of the register are correspondingly written into the register test list, and operand information corresponding to each register address is written into a row in which the register address is located. Then the register addresses in the register address column of the register test list are traversed. For each piece of operand information of each register address, a quantity of bits, a read/write type, and a default register value that correspond to the register address are searched for in the register task allocation list and written into the register test list, so as to ensure that relevant information of each operand of each register in the register task allocation list is written into the register test list without omission.

For example, the register task allocation list shown in FIG. 1A and FIG. 1B is still used as an example. As shown in FIG. 1A and FIG. 1B, in JEDEC DDR5 protocol information, each mode register corresponds to eight operands, and a formed register test list is shown in Table 2 below:

| Register | Sub Register | Bit | Type | Default Value |
|---|---|---|---|---|
| 0 | Burst Length | 0 | R/W | 0 |
| 0 | Burst Length | 1 | R/W | 0 |
| 0 | CAS Latency (RL) | 2 | R/W | 0 |
| 0 | CAS Latency (RL) | 3 | R/W | 0 |
| 0 | CAS Latency (RL) | 4 | R/W | 0 |
| 0 | CAS Latency (RL) | 5 | R/W | 0 |
| 0 | CAS Latency (RL) | 6 | R/W | 0 |
| 0 | RFU | 7 | RFU | 0 |
| 1 | PDA Enumerate ID | 0 | R | 0 |
| 1 | PDA Enumerate ID | 1 | R | 0 |
| 1 | PDA Enumerate ID | 2 | R | 0 |
| 1 | PDA Enumerate ID | 3 | R | 0 |
| 1 | PDA Select ID | 4 | R | 0 |
| 1 | PDA Select ID | 5 | R | 0 |
| 1 | PDA Select ID | 6 | R | 0 |
| 1 | PDA Select ID | 7 | R | 0 |
| 2 | Read Preamble Training | 0 | R/W | 0 |
| 2 | Write Leveling Training | 1 | R/W | 0 |
| 2 | 2N Mode | 2 | R | 0 |
| 2 | MPSM | 3 | R/W | 0 |
| 2 | MPC | 4 | R/W | 0 |
| 2 | Device 15 MPSM | 5 | R/W | 0 |
| 2 | Reserved | 6 | Reserved | 0 |
| 2 | Internal Write Timing | 7 | R/W | 0 |

In the above table, test item information in each row forms a test item information group, and eight test item information groups are formed for each register. It can be understood that the above table only shows test item information of register 0, register 1, and register 2 in the register test list, and test item information of other registers in the register test list is not shown, which is similar to the test item information of register 0, register 1, and register 2.

It can be seen from the above table that each operand represents a different operation item or function for some registers such as register 2 in the table, while a plurality of operands represent a same operation item or function for some registers. For example, for register 0 in the table, OP [0] and OP [1] represent a same burst length, and OP [2] to OP [6] represent a same CAS latency (RL). For another example, for register 1 in the table, OP [0] to OP [3] represent a same PDA enumerate ID, and OP [4] to OP [7] represent a same PDA Select ID. In an embodiment, bit_len in the test case template is used to indicate a plurality of pieces of operand information. For example, when a test case is generated for register 0, because OP [2] to OP [6] of register 0 represent the same RL, bit_len can be set to 5 bits correspondingly for the RL. This can further reduce the difficulty and cycle of generating the case file and improve the efficiency.

In an embodiment, in order to avoid omission of register data in a process of converting the register task allocation list into the register test list, after the register test list is formed, a quantity of registers in the register test list is counted and compared with a quantity of registers in the register task allocation list. For example, after the register test list shown in Table 2 is formed, a quantity L of rows of the register test list (the quantity of rows described herein is a quantity of actual content rows, excluding the header of the list) is counted, and the quantity N1 of registers and a quantity N2 of operands in the register task allocation list are obtained. A product of the quantity N1 of registers and the quantity N2 of operands is calculated. If L=N1*N2, it is determined that no omission occurs in the list conversion process; if L≠N1*N2, it indicates that an error occurs in the list conversion process.

In this embodiment, when it is determined that an error occurs in the conversion process, the process of converting the register task allocation list into the register test list may be re-executed; or operands of each register in the register task allocation list may be compared with those of each register in the register test list to determine a missing register and operand, and each piece of test item information corresponding to the missing register and operand is added to the register test list, which can improve efficiency and reduce an amount of operation.

As described above, when the preset test environment changes, for example, when the to-be-tested protocol is upgraded, the register test adaptation file can be changed. In some embodiments, whether the preset test environment has changed can be determined by detecting version information. For example, before chip testing, a header file of the protocol information is parsed to extract the version information from the header file, and the version information is compared with original version information. If the version information is inconsistent with the original version information, it is determined that the preset test environment has changed and the register test adaptation file needs to be changed.

Figure 6:
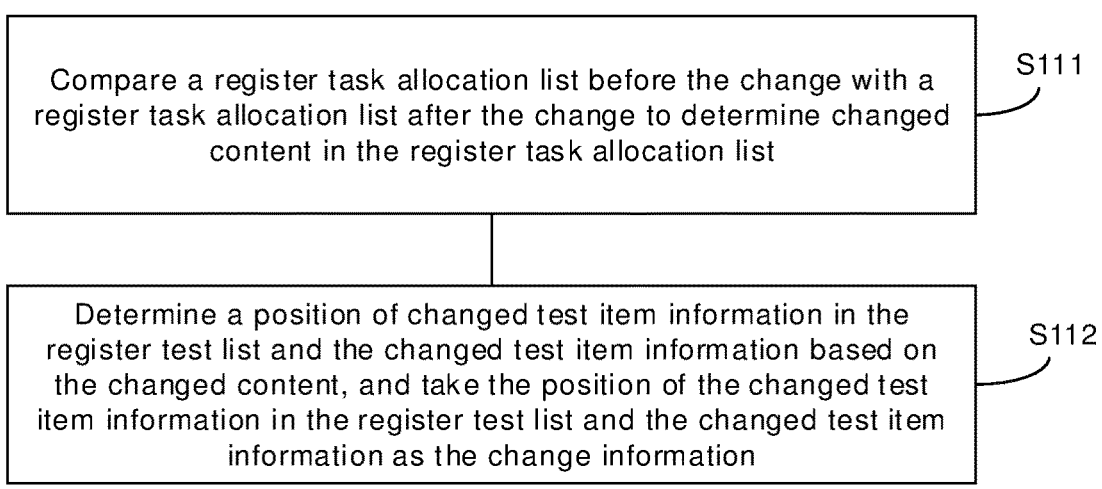
FIG. 6 is a flowchart of a chip test method according to an exemplary embodiment.

In an embodiment in which the register description file is the register task allocation list and the register test adaptation file is the register test list, as shown in FIG. 6, a method for determining the change information of the register description file includes the following steps:

S111: Compare a register task allocation list before the change with a register task allocation list after the change to determine changed content in the register task allocation list.

S112: Determine a position of changed test item information in the register test list and the changed test item information based on the changed content, and take the position of the changed test item information in the register test list and the changed test item information as the change information.

When step S111 is performed, content in the register task allocation list before the change is compared with that in the register task allocation list after the change to determine a changed item. The register task allocation list shown in FIG. 1a and FIG. 1b is still taken as an example. When the DDR5 protocol is upgraded, as shown in FIG. 1a, a part indicated by a dotted line in FIG. 1a changes. After comparison, it is determined that content corresponding to OP [5] of mode register 4 changes, and then a table of a relationship between the register function and the register feature information after the protocol upgrade is searched for to determine a register address, a quantity of bits, a read/write type, a default value, and other test item information corresponding to OP [5] of mode register 4. In addition, a position, for example, a row number, of OP [5] of mode register 4 in the register test list is determined, such that in step S120, row information corresponding to OP [5] of mode register 4 in the register test list is updated and modified to the test item information determined in step S112.

In this embodiment, the register task allocation list before the change is compared with the register task allocation list after the change, such that the changed content can be easily determined. Only corresponding row information in the register test list needs to be updated based on the changed content, and there is no need to re-generate the register test list, which reduces the amount of operation, increases an operation speed, and greatly improves test efficiency.

In this embodiment, when the row information is updated, only changed test item information may be updated, or the row information may be replaced as a whole to reduce a comparison operation.

The test case can be executed after being constructed, so as to test the chip. For example, for a readable and writable register (the read/write type in the corresponding list is R/W), an initial value of the register is read, and then whether the read value is consistent with a default register value (the default value in the corresponding list) is determined. If the read value is consistent with the default register value, it can be considered that the default register value of the register is correct. After that, a write operation is performed on the register, and then a related value of the register is read. If the read value is consistent with a written value, it can be considered that reading and writing functions of the register are normal.

For a read-only register (the read/write type in the corresponding list is R), when no operation is performed on the register, a register value is read, and whether the register value is consistent with a default register value is determined. If the register value is consistent with the default register value, it can be considered that the default register value of the register is correct. After that, a write operation is performed on the register. If a written value affects a value of the register, it can be determined that a type of the register is incorrect. For example, the default register value of the register is 0. After 1 is written into the register, if the value of the register changes to 1, it indicates that the type of the register is incorrect. If the value of the register is still 0, it indicates that the type of the register is correct. It can be understood that default register values in the test case may be set to a same value, for example, 0 or 1; may be set to different values according to provisions of corresponding standard files; or may be set to different values based on a test need, so as to test different register default values in a complex test environment.

In order to ensure that each register is tested or each operand of each register is tested, a position of a register in the register test list can be marked after the register is tested. After all tests are completed, the register test list is searched to determine whether there is an unmarked test row. If there is an unmarked test row, it indicates that there is a missing test. For a missing test row, the register is continuously tested until no unmarked test row can be found. For example, each row in the register test list is provided with a header file with a label bit. When no test is conducted for the row, the label bit is 0. After the test is completed for the row, the label bit is modified to 1. In other embodiments, a corresponding row of a register in the register test list may alternatively be deleted after the register is tested. After all tests are completed, the register test list is searched to determine whether there still is row information. If there still is row information, it indicates that there is a missing test. For a missing test row, the register is continuously tested until the register test list is empty.

In the chip test method provided in this embodiment of the present disclosure, the register test adaptation file whose form matches the form of the test case template is determined based on the register description file, and then the test case is constructed based on the register test adaptation file to test the chip. Therefore, there is no need to search for and input register information cumbersomely, which improves test efficiency of the chip, reduces an error rate, and improves test accuracy. In addition, when the register test adaptation file is determined, the register test adaptation file can be adaptively changed in response to the change of the preset test environment without rebuilding the test environment, which improves test flexibility and test efficiency and facilitates later maintenance.

Figure 7:
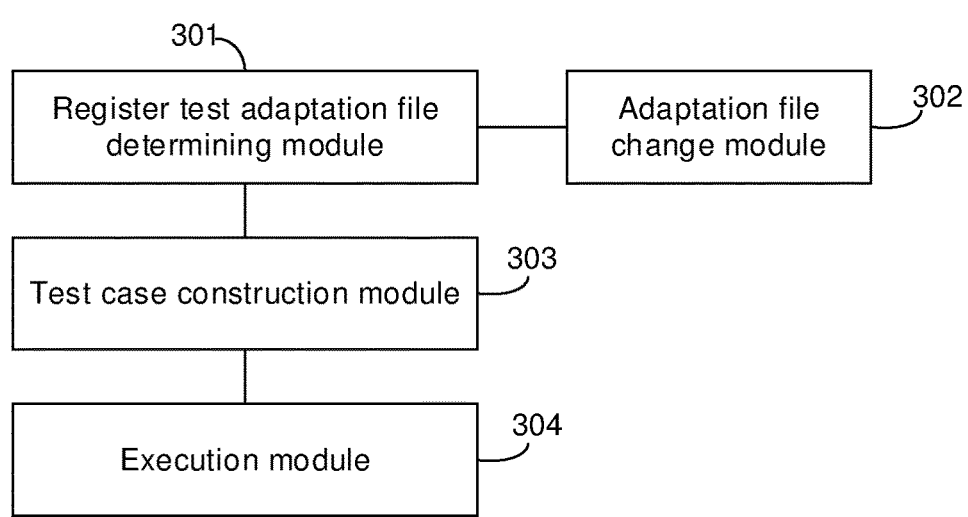
FIG. 7 is a block diagram of a chip test apparatus according to an exemplary embodiment.

FIG. 7 is a block diagram of a chip test apparatus according to an exemplary embodiment. As shown in FIG. 7, the chip test apparatus includes at least a register test adaptation file determining module 301, an adaptation file change module 302, a test case construction module 303, and an execution module 304.

The register test adaptation file determining module 301 is configured to determine a register test adaptation file based on a register description file under a preset test environment, wherein a form of the register test adaptation file matches a form of a predetermined test case template.

The adaptation file change module 302 is coupled to the register test adaptation file determining module 301, and configured to determine change information of the register description file when the preset test environment changes, and send a change command to the register test adaptation file determining module to change the register test adaptation file.

The test case construction module 303 is configured to construct a test case based on the register test adaptation file and the test case template.

The execution module 304 is configured to execute the test case to test a chip.

In an exemplary embodiment, the register test adaptation file determining module 301 is configured to:
  obtain protocol information corresponding to the preset test environment;
  extract a register task allocation list from the protocol information, and take the register task allocation list as the register description file; and
  convert the register task allocation list into a register test list, and take the register test list as the register test adaptation file.

In an exemplary embodiment, the test case template includes a plurality of different to-be-configured test items, and the register test adaptation file determining module 301 is configured to:
  parse the register task allocation list to determine test item information of each register, wherein each register corresponds to at least one test item information group, and each of the at least one test item information group includes a plurality pieces of test item information that are in a one-to-one correspondence with the different to-be-configured test items; and
  generate the register test list based on the determined test item information of each register, wherein each row of the register test list includes the plurality pieces of test item information in one test item information group, and each column of the register test list corresponds to test item information of a same test item.

In an exemplary embodiment, an arrangement order of the plurality pieces of test item information in each row of the register test list is consistent with that of the different to-be-configured test items in the test case template.

In an exemplary embodiment, the test case template includes:
  task Reg(reg_addr, bit_addr, bit_len, Wr_Rd, default value), wherein
  reg_addr represents a register address, bit_addr represents operand information, bit_len represents a quantity of bits, Wr_Rd represents a read/write type, and default value indicates a default register value.

In an exemplary embodiment, default register values in the test case are different.

In an exemplary embodiment, when the register description file is the register task allocation list and the register test adaptation file is the register test list, the adaptation file change module 302 is configured to:
  compare a register task allocation list before the change with a register task allocation list after the change to determine changed content in the register task allocation list; and
  determine a position of changed test item information in the register test list and the changed test item information based on the changed content, and take the position of the changed test item information in the register test list and the changed test item information as the change information.

Figure 8:
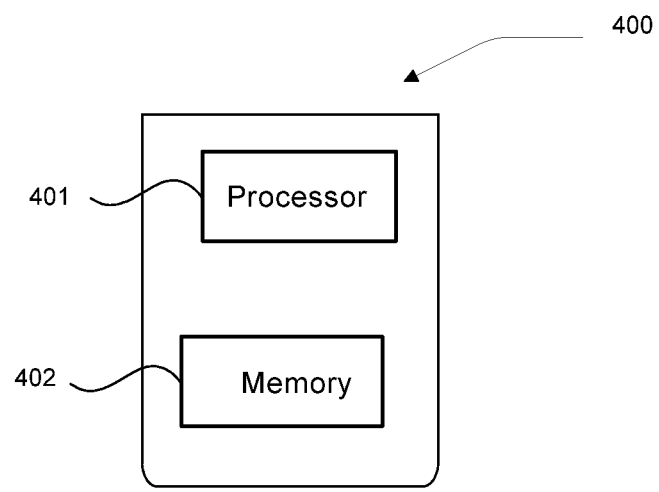
FIG. 8 is a block diagram of a chip test device according to an exemplary embodiment.

FIG. 8 is a block diagram of a chip test device, namely, a computer device 400, according to an exemplary embodiment. For example, the computer device 400 can be provided as a terminal device. Referring to FIG. 8, the computer device 400 includes a processor 401, and one or more processors may be set as required. The computer device 400 further includes a memory 402, configured to store an instruction executable by the processor 401, such as an application program. One or more memories may be set as required. The memory may store one or more application programs. The processor 401 is configured to execute the instruction to perform the above-mentioned method.

Persons skilled in the art should understand that the embodiments of the present disclosure may be provided as a method, an apparatus (device), or a computer program product. Therefore, the present disclosure may use a form of hardware only embodiments, software only embodiments, or embodiments with a combination of software and hardware. Moreover, the present disclosure may be in a form of a computer program product that is implemented on one or more computer-usable storage media that include computer-usable program code. The computer storage media include volatile, non-volatile, removable, and non-removable media implemented in any method or technology for storing information (such as computer-readable instructions, data structures, program modules, or other data), including but not limited to, a random access memory (RAM), a read-only memory (ROM), an electrically erasable programmable read-only memory (EEPROM), a flash memory or other storage technologies, a compact disc read-only memory (CD-ROM), a digital versatile disk (DVD) or other optical disc storage, a magnetic cassette, a magnetic tape, magnetic disk storage or other magnetic storage apparatuses, or any other medium that can be used to store desired information and can be accessed by a computer. In addition, as is well known to persons skilled in the art, communication media usually contain computer-readable instructions, data structures, program modules, or other data in modulated data signals such as carrier waves or other transmission mechanisms, and may include any information transfer medium.

In an exemplary embodiment, a non-transitory computer-readable storage medium including an instruction is provided, for example, the memory 402 including the instruction, and the instruction may be executed by the processor 401 of the computer device 400 to accomplish the method described above. For example, the non-transitory computer-readable storage medium may be a ROM, a RAM, a CD-ROM, a magnetic tape, a floppy disk, an optical data storage device, or the like.

A non-transitory computer-readable storage medium is provided. When executed by a processor of a chip test device, an instruction in the non-transitory computer-readable storage medium enables the chip test device to perform the following steps:
  determining a register test adaptation file based on a register description file under a preset test environment, wherein a form of the register test adaptation file matches a form of a predetermined test case template;
  constructing a test case based on the register test adaptation file and the test case template, and executing the test case to test a chip, wherein
  the determining a register test adaptation file further includes: when the preset test environment changes, determining change information of the register description file in response to the change; and
  changing the register test adaptation file based on the change information.

The present disclosure is described with reference to the flowcharts and/or block diagrams of the method, the apparatus (device), and the computer program product according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of another programmable data processing device to generate a machine, such that the instructions executed by a computer or a processor of another programmable data processing device generate an apparatus for implementing a specific function in one or more processes in the flowcharts and/or in one or more blocks in the block diagrams.

These computer program instructions may also be stored in a computer readable memory that can instruct a computer or another programmable data processing device to work in a specific manner, such that the instructions stored in the computer readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing device, such that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

In the present disclosure, the terms "include", "comprise", or any other variations thereof are intended to cover a non-exclusive inclusion, such that an article or a device including a series of elements not only includes those elements, but also includes other elements that are not explicitly listed, or also includes inherent elements of the article or the device. Without more restrictions, the elements defined by the statement "including a . . . " do not exclude the existence of other identical elements in the article or device including the elements.

Although some preferred embodiments of the present disclosure have been described, persons skilled in the art can make changes and modifications to these embodiments once they learn the basic inventive concept. Therefore, the appended claims are intended to be interpreted as including the preferred embodiments and all changes and modifications falling within the scope of the present disclosure.

Apparently, persons skilled in the art can make various changes and modifications to the present disclosure without departing from the spirit and scope of the present disclosure. In this way, if these changes and modifications to the present disclosure fall within the scope of the claims of the present disclosure and equivalent technologies thereof, the present disclosure is further intended to include these changes and modifications.

The invention claimed is:

1. A chip test method, used to test a chip under a preset test environment, wherein the chip test method comprises:
   determining a register test adaptation file based on a register description file under the preset test environment, wherein a form of the register test adaptation file matches a form of a predetermined test case template;
   constructing a test case based on the register test adaptation file and the test case template, and executing the test case to test the chip, wherein
   the determining a register test adaptation file further comprises: when the preset test environment changes, determining change information of the register description file in response to the change; and
   changing the register test adaptation file based on the change information.

2. The chip test method according to claim 1, wherein the determining a register test adaptation file based on a register description file under the preset test environment comprises:
   obtaining protocol information corresponding to the preset test environment;
   extracting a register task allocation list from the protocol information, and taking the register task allocation list as the register description file; and
   converting the register task allocation list into a register test list, and taking the register test list as the register test adaptation file.

3. The chip test method according to claim 2, wherein the test case template comprises a plurality of different to-be-configured test items, and the converting the register task allocation list into a register test list comprises:
   parsing the register task allocation list to determine test item information of each register, wherein each register corresponds to at least one test item information group, and each of the at least one test item information group comprises a plurality pieces of test item information that are in a one-to-one correspondence with the different to-be-configured test items; and
   generating the register test list based on the determined test item information of each register, wherein each row of the register test list comprises the plurality pieces of test item information in one test item information group, and test item information in each column of the register test list corresponds to one of the to-be-configured test items.

4. The chip test method according to claim 3, wherein an arrangement order of the plurality pieces of test item information in each row of the register test list is consistent with an arrangement order of the different to-be-configured test items in the test case template.

5. The chip test method according to claim 3, wherein the test case template comprises:
   Task Reg(reg_addr, bit_addr, bit_len, Wr_Rd, default value), wherein
   reg_addr represents a register address, bit_addr represents operand information, bit_len represents a quantity of bits, Wr_Rd represents a read/write type, and default value indicates a default register value.

6. The chip test method according to claim 5, wherein default register values in the test case are different.

7. The chip test method according to claim 1, wherein when the register description file is a register task allocation list and the register test adaptation file is a register test list, the determining change information of the register description file comprises:
   comparing the register task allocation list before the change with the register task allocation list after the change to determine changed content in the register task allocation list; and
   determining a position of changed test item information in the register test list and the changed test item information based on the changed content, and taking the position of the changed test item information in the register test list and the changed test item information as the change information.

8. A chip test apparatus, configured to test a chip under a preset test environment, wherein the chip test apparatus comprises:
   one or more processors; and
   a storage apparatus, configured to store one or more programs, wherein the one or more programs, when executed by the one or more processors, cause the one or more processors to execute operations of:

determining a register test adaptation file based on a register description file under the preset test environment, wherein a form of the register test adaptation file matches a form of a predetermined test case template;

determining change information of the register description file when the preset test environment changes, and changing the register test adaptation file;

constructing a test case based on the register test adaptation file and the test case template; and executing the test case to test the chip.

9. The chip test apparatus according to claim 8, wherein the one or more programs cause the one or more processors to execute operations of:

obtaining protocol information corresponding to the preset test environment;

extracting a register task allocation list from the protocol information, and take the register task allocation list as the register description file; and converting the register task allocation list into a register test list, and take the register test list as the register test adaptation file.

10. The chip test apparatus according to claim 9, wherein the test case template comprises a plurality of different to-be-configured test items, the one or more programs cause the one or more processors to execute operations of:

parsing the register task allocation list to determine test item information of each register, wherein each register corresponds to at least one test item information group, and each of the at least one test item information group comprises a plurality pieces of test item information that are in a one-to-one correspondence with the different to-be-configured test items; and generating the register test list based on the determined test item information of each register, wherein each row of the register test list comprises the plurality pieces of test item information in one test item information group, and each column of the register test list corresponds to test item information of a same test item.

11. The chip test apparatus according to claim 10, wherein an arrangement order of the plurality pieces of test item information in each row of the register test list is consistent with an arrangement order of the different to-be-configured test items in the test case template.

12. The chip test apparatus according to claim 10, wherein the test case template comprises:

task Reg(reg_addr, bit_addr, bit_len, Wr_Rd, default value), wherein reg_addr represents a register address, bit_addr represents operand information, bit_len represents a quantity of bits, Wr_Rd represents a read/write type, and default value indicates a default register value.

13. The chip test apparatus according to claim 12, wherein default register values in the test case are different.

14. The chip test apparatus according to claim 8, wherein when the register description file is a register task allocation list and the register test adaptation file is a register test list, the one or more programs cause the one or more processors to execute operations of:

comparing the register task allocation list before the change with the register task allocation list after the change to determine changed content in the register task allocation list; and determining a position of changed test item information in the register test list and the changed test item information based on the changed content, and take the position of the changed test item information in the register test list and the changed test item information as the change information.

15. A non-transitory computer-readable storage medium, wherein executed by a processor of a test device, an instruction in the non-transitory computer-readable storage medium enables the test device to perform the following operations:

determining a register test adaptation file based on a register description file under a preset test environment, wherein a form of the register test adaptation file matches a form of a predetermined test case template;

constructing a test case based on the register test adaptation file and the test case template, and executing the test case to test a chip, wherein the determining a register test adaptation file further comprises: when the preset test environment changes, determining change information of the register description file in response to the change; and changing the register test adaptation file based on the change information.

* * * * *